(12) United States Patent
Yamazaki et al.

(10) Patent No.: US 6,858,878 B2
(45) Date of Patent: Feb. 22, 2005

(54) LIGHT-EMITTING DEVICE AND ELECTRIC APPARATUS

(75) Inventors: Shunpei Yamazaki, Tokyo (JP); Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 69 days.

(21) Appl. No.: 10/337,416

(22) Filed: Jan. 7, 2003

(65) Prior Publication Data

US 2003/0146446 A1 Aug. 7, 2003

Related U.S. Application Data

(62) Division of application No. 09/848,233, filed on May 4, 2001, now Pat. No. 6,515,310.

(30) Foreign Application Priority Data

May 6, 2000 (JP) ........................................ 2000-172745

(51) Int. Cl.⁷ .............................................. H01L 33/00

(52) U.S. Cl. .............................. 257/98; 257/91; 257/99; 257/744; 257/745; 257/749; 313/503; 313/491; 313/492

(58) Field of Search .............................. 257/98, 91, 99, 257/744, 745, 749; 313/503, 491, 492

(56) References Cited

U.S. PATENT DOCUMENTS

| | | | |
|---|---|---|---|
| 5,986,401 A | * 11/1999 | Thompson et al. | ......... 313/504 |
| 6,262,441 B1 | 7/2001 | Bohler et al. | |
| 6,284,393 B1 | 9/2001 | Hosokawa et al. | |
| 6,297,495 B1 | * 10/2001 | Bulovic et al. | .......... 250/214.1 |

* cited by examiner

Primary Examiner—Nathan J. Flynn
Assistant Examiner—Remmon R. Forde
(74) Attorney, Agent, or Firm—Fish & Richardson P.C.

(57) ABSTRACT

A light shield film is provided adjacent to an anode of an EL element that consists of the anode, an EL layer, and a cathode. The anode and the cathode are transparent or semitransparent to visible light and hence transmit EL light. With this structure, ambient light is absorbed by the light shield film and does not reach an observer. This prevents an external view from appearing on the observation surface.

30 Claims, 12 Drawing Sheets

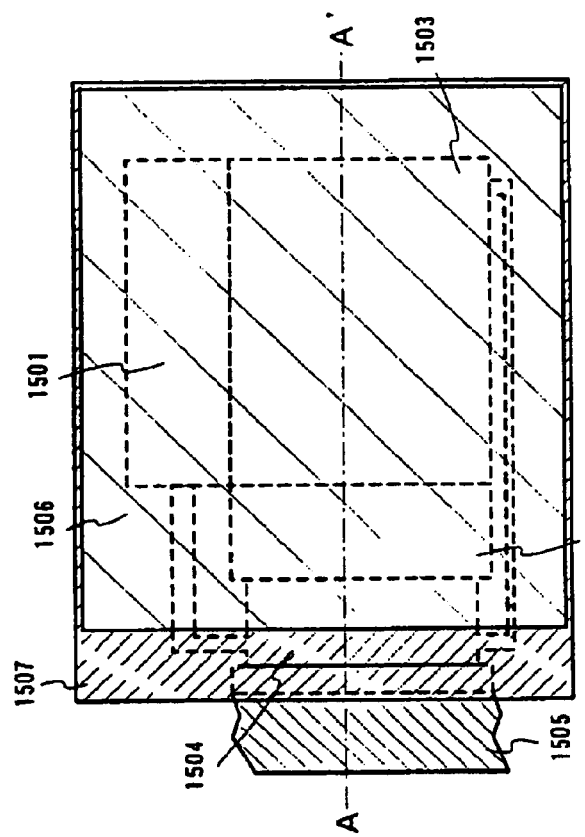
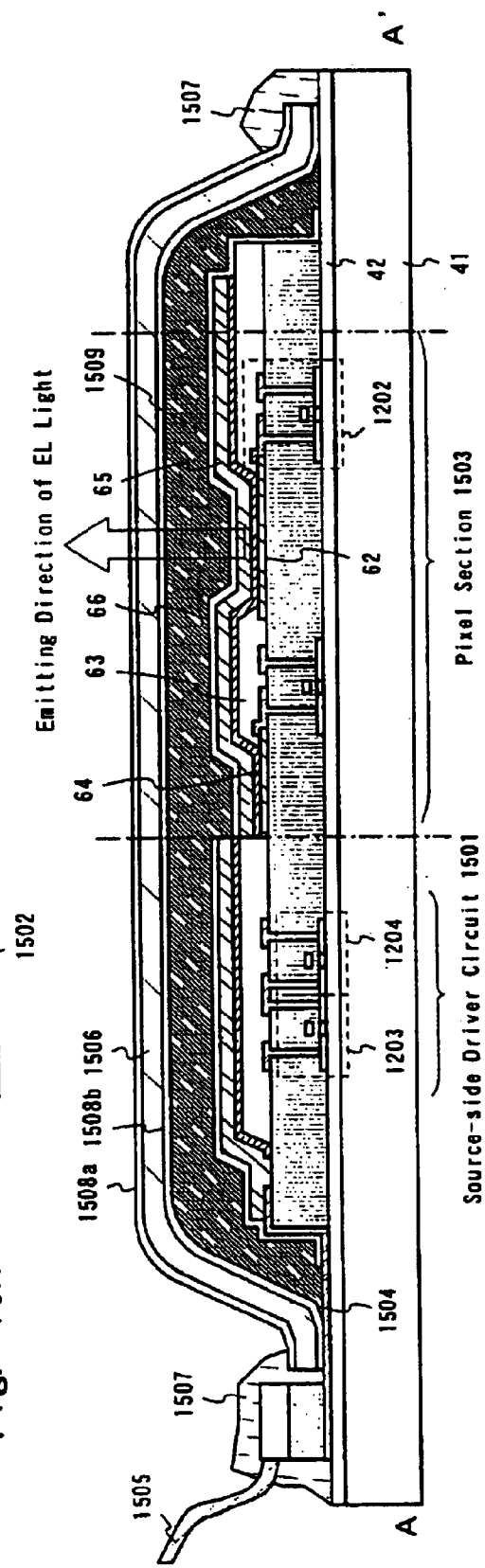
Fig. 15A
Fig. 15B

LIGHT-EMITTING DEVICE AND ELECTRIC APPARATUS

CROSS-REFERENCE TO RELATED APPLICATIONS

This application is a divisional application of U.S. application Ser. No. 09/848,233, filed on May 4, 2001 which claims the benefit of a foreign priority application filed in Japan, Serial No. 2000-172745, filed May 6, 2000, which is incorporated herein by reference.

BACKGROUND OF THE INVENTION

1. Field of the Invention

The present invention relates to a device (hereinafter referred to as "light-emitting device") having an element (hereinafter referred to as "light-emitting element") in which a thin film made of a light-emissive material is interposed between a pair of electrodes (an anode and a cathode). In particular, the invention relates to a light-emitting device having a light-emitting element (hereinafter referred to as "EL element") using a thin film that is made of a light-emissive material capable of EL (electroluminescence). The organic EL display and the organic light-emitting diode (OLED) are included in the light-emitting device according to the invention.

All light-emissive materials that emit light (phosphorescence and/or fluorescence) through singlet excitation or triplet excitation or both are part of the light-emissive materials that can be used in the invention.

2. Description of the Related Art

Light-emitting devices (hereinafter referred to as "EL light-emitting devices") having an EL element are now being developed. EL light-emitting devices are classified into the passive matrix type and the active matrix type, and EL light-emitting devices of both types operate on the principle that a current is caused to flow through an EL element and thereby a thin film (light-emitting layer) made of a light-emissive material capable of EL emits light.

FIG. 2 shows the structure of a general EL element. As shown in FIG. 2, an EL element 200 is formed by laying an anode 202, a light-emitting layer 203, and a cathode 204 one on another on an insulator 201. In general, the cathode 204 as an electron supply source is a metal electrode having a small work function and the anode 202 as a hole supply source is an oxide conductive film (typically, an ITO film) that has a large work function and is transparent to visible light. This is because the metal electrode as the cathode 204 is opaque to visible light and hence light (hereinafter referred to as EL light) that is generated in the light-emitting layer cannot be observed unless the anode 202 is transparent to visible light.

The EL light 205 is observed after directly passing through the anode 202 or being reflected by the cathode 204 and then passing through the anode 202. That is, an observer 206 can observe the EL light 205 that originates from pixels where the light-emitting layer 203 emits light and that then passes through the anode 202.

However, there is a problem that incident ambient light (i.e., light outside the light-emitting device) 207 is reflected by the back surface (i.e., the surface adjacent to the light emitting layer) of the cathode 204 in pixels that are not emitting light and the back surface of the cathode 204 acts like a mirror, whereby an external view appears on the observation surface (i.e., the surface on the observer 206 side). One measure against this problem is to attach a circularly polarizing film to the observation surface of an EL light-emitting device. However, a problem still exists that the circularly polarizing film is very expensive and hence its employment increases the manufacturing cost.

SUMMARY OF THE INVENTION

The present invention has been made in view of the above problems in the art, and an object of the invention is therefore to prevent an EL light-emitting device from acting like a mirror surface without using a circularly polarizing film and thereby provide an inexpensive EL light-emitting device through reduction of its manufacturing cost.

Another object of the invention is to provide an inexpensive electric apparatus having such an EL light-emitting device as a display unit.

In a light-emitting device according to the invention, it is characterized that both of a pair of electrodes (an anode and a cathode) that constitute a light-emitting element (typically, an EL element) are formed from the conductive film that is transparent or semitransparent to visible light, and that a light shield film is provided adjacent to the light-emitting element or provided above or below the light-emitting element with an insulating film or a conductive film interposed in between. That is, it is characterized that a light-emitting layer and the light shield film are provided with one of the pair of electrodes interposed in between, or that the light shield film is provided on the anode side or the cathode side of the light-emitting element.

In this specification, the term "transparent to visible light" means that the transmittance for visible light is 80–100% and the term "semitransparent to visible light" means that the transmittance for visible light is 50–80%. Naturally, the transmittance depends on the film thickness. The film thickness may be designed properly so that the transmittance falls within the above range.

FIG. 1A shows the character of a light-emitting device according to the invention. As shown in FIG. 1A, a light shield film 104 is provided adjacent to an EL element 100 that consists of an anode 101, an EL layer 102, and a cathode 103. The anode 101 and the cathode 103 are transparent or semitransparent to visible light. To this end, it is preferable that the anode 101 be an oxide conductive film having a work function of 4.5–5.5.

The cathode 103 needs to be a conductive film (typically, a metal film containing a group-1 or group-2 element in the periodic table) having a work function of 2.0–3.5. Since in many cases such a metal film is opaque to visible light, it is preferable to employ a structure shown in FIG. 1B, which is an enlarged view of the EL element 100. As shown in FIG. 1B, the cathode 103 consists of a semitransparent electrode 103a and a transparent electrode 103b.

The semitransparent electrode 103a is a metal film containing a group-1 or group-2 element in the periodic table. Being as thin as 5–70 nm (preferably, 10–30 nm), the metal film is semitransparent to visible light. The transparent electrode 103b is an oxide conductive film that is transparent to visible light.

The EL layer 102 may have a known structure. That is, the EL layer 102 may be an undoped light-emitting layer or a light-emitting layer containing a dopant (e.g., an organic material that emits light through triplet excitation).

A lamination structure may be formed in which a carrier (electron or hole) injection layer, a carrier transport layer, or a carrier stop layer is laid on a light-emitting layer.

Although in FIG. 1A the light shield film 104 is provided adjacent to the anode 101, it may be provided adjacent to the cathode 103. An insulating film or a conductive film may be provided between the light shield film 104 and the anode 101 (or between the light shield film 104 and the cathode 103).

In the invention, the light shield film may be a thin film that is made of a material having a large absorption coefficient for visible light. Typical examples of the light shield film are an insulating film (preferably, a resin film) dispersed with metal particles or carbon particles, a metal film (preferably, a titanium film, a titanium nitride film, a chromium film, a molybdenum film, a tungsten film, a tantalum film, or a tantalum nitride film) having a small reflectance value, and a semiconductor film.

With the structure of FIG. 1A, EL light 105 can pass through the cathode 103 and hence is observed directly by an observer 106. Most of ambient light 107 reaching the light shield film 104 is absorbed by the light shield film 104 and hence reflection light is weak enough to be unproblematic. That is, the reflection light does not reach the observer 106 and hence the problem that an external view appears on the observation surface can be solved.

Capable of solving the problem in the prior art without the need for using an expensive circularly polarizing film, the invention makes it possible to provide inexpensive light-emitting devices. Further, inexpensive electric apparatuses can be provided by using a light-emitting device according to the invention as a display unit.

BRIEF DESCRIPTION OF THE DRAWINGS

FIGS. 15A and 15B show a top-view structure and a sectional structure, respectively, of a light-emitting device according to a ninth embodiment of the invention;

DESCRIPTION OF THE PREFERRED EMBODIMENTS

Figure 1A:
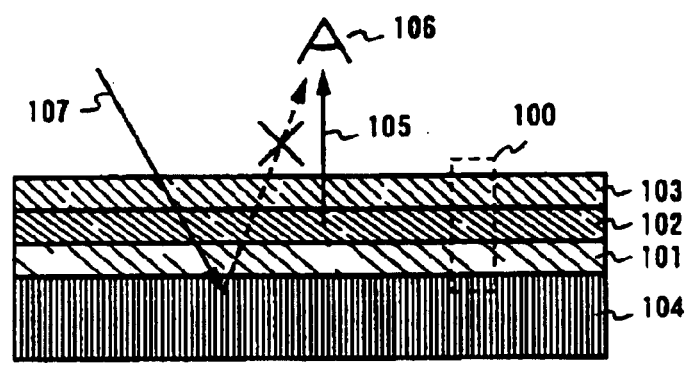
FIGS. 1A and 1B show the structure of a pixel section of a light-emitting device according to the present invention.
Figure 1B:
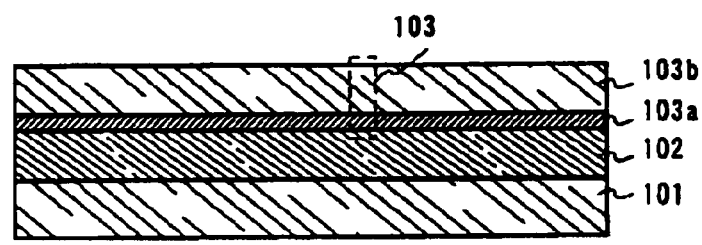
Figure 2:
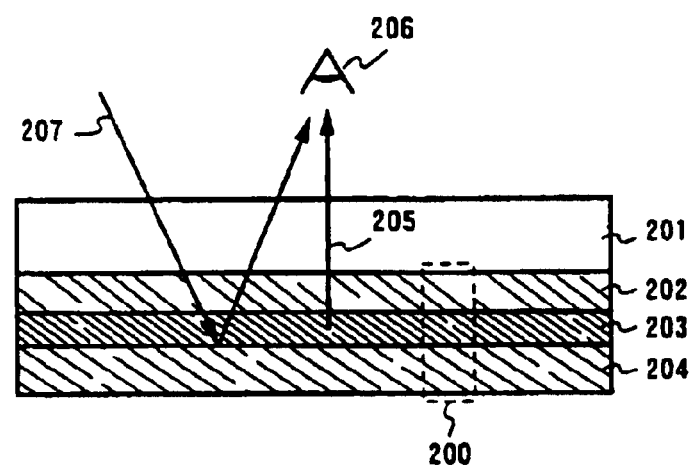
FIG. 2 shows the structure of a pixel section of a conventional light-emitting device.
Figure 3A:
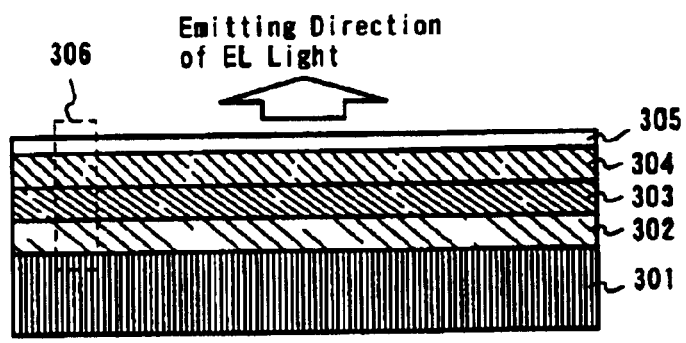
FIGS. 3A and 3B show the structure of a pixel section of a light-emitting device according to a fundamental embodiment of the invention.
Figure 3B:
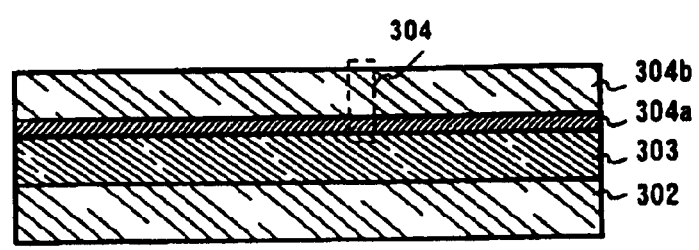

A fundamental embodiment of the present invention will be hereinafter described with reference to FIGS. 3A and 3B and FIGS. 4A and 4B. First, a light-emitting device of FIGS. 3A and 3B is such that a light shield film is provided adjacent to an anode. In the fundamental embodiment, the light shield film is an insulating film that is dispersed with metal particles or carbon particles.

As shown in FIG. 3A, an EL element 306 consisting of an anode 302, an EL layer 303, and a cathode 304 is formed on a light shield film 301. A protective film 305 is formed on the cathode 304. To enhance the light shield performance, it is preferable that the thickness of the light shield film 301 be 200 nm or more (even preferably, 300 nm-2 $\mu$m).

It is preferable that the anode 302 be an oxide conductive film having a work function of 4.5–5.5. It is preferable that the cathode 304 have a structure shown in FIG. 3B, which is an enlarged view of the EL element 306. The cathode 304 consists of a semitransparent electrode 304a and a transparent electrode 304b.

The semitransparent electrode 304a is an electrode that is a metal film containing a group-1 or group-2 element in the periodic table. Being as thin as 5–70 nm (preferably, 10–30 nm), the semitransparent electrode 304a is semitransparent to visible light. The transparent electrode 304b, which is an electrode that is an oxide conductive film, is transparent to visible light.

The EL layer 303 may have a known structure. That is, the EL layer 303 may be an undoped light-emitting layer or a light-emitting layer containing a dopant (e.g., an organic material that emits light through triplet excitation).

A lamination structure may be formed in which a carrier (electron or hole) injection layer, a carrier transport layer, or a carrier stop layer is laid on a light-emitting layer.

The protective film 305 is an insulating film that is transparent or semitransparent to visible light. It is preferable that the protective film 305 be an insulating film that does not tend to transmit oxygen and water The protective film 305 is provided to protect the EL layer 303 (in particular, the light-emitting layer) and the cathode 304 because they tend to be deteriorated by oxygen or water. It is preferable that the protective film 305 be a silicon nitride film, a silicon oxynitride ($SiO_xN_y$) film, a tantalum oxide film, an aluminum oxide film, or a carbon film (preferably, a diamond-like carbon film).

The structure of FIG. 3A can be applied to both of passive matrix light-emitting devices and active matrix light-emitting devices. Where it is applied to an active matrix light-emitting device, it is preferable that a thin-film transistor (hereinafter referred to as "TFT") that is electrically connected to the EL element be a p-channel TFT because it is connected to the anode 302. In this case, the manufacturing cost of the light-emitting device can be reduced by making all the TFTs included therein p-channel ones.

Figure 4A:
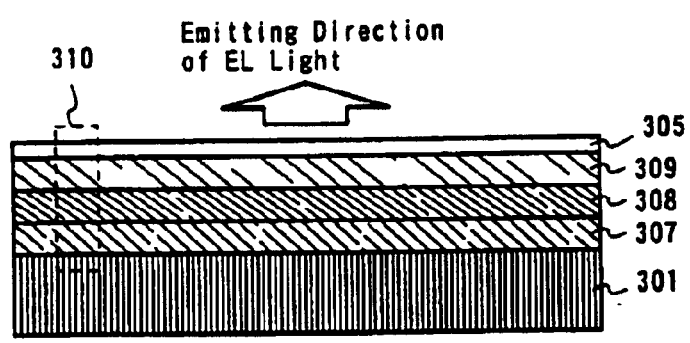
FIGS. 4A and 4B show the structure of a pixel section of another light-emitting device according to the fundamental embodiment of the invention.

FIG. 4A shows another light-emitting device according to the fundamental embodiment in which a light shield film is provided adjacent to a cathode. For the components that are given the same reference numerals as used in FIG. 3A, refer to their descriptions that were made above with reference to FIGS. 3A and 3B. As shown in FIG. 4A, an EL element 310 consisting of a cathode 307, an EL layer 308, and an anode 309 is formed on a light shield film 301.

It is preferable that the anode 309 be an oxide conductive film having a work function of 4.5–5.5. It is preferable that the cathode 307 have a structure shown in FIG. 4B, which is an enlarged view of the EL element 310. The cathode 307 consists of a semitransparent electrode 307a and a transparent electrode 307b.

The semitransparent electrode 307a is an electrode that is a metal film containing a group-1 or group-2 element in the periodic table. Being as thin as 5–70 nm (preferably, 10–30 nm), the semitransparent electrode 307a is semitransparent to visible light. The transparent electrode 307b, which is an electrode that is an oxide conductive film, is transparent to visible light.

The EL layer 308 may have a known structure. That is, the EL layer 308 may be an undoped light-emitting layer or a light-emitting layer containing a dopant (e.g., an organic material that emits light through triplet excitation).

A lamination structure may be formed in which a carrier (electron or hole) injection layer, a carrier transport layer, or a carrier stop layer may be laid on a light-emitting layer. This lamination structure is opposite in the order of arrangement of the constituent layers to the lamination structure of the EL layer 303 shown in FIG. 3A because of the difference in the positions of the cathode and the anode.

The structure of FIG. 4A can be applied to both of passive matrix light-emitting devices and active matrix light-emitting devices. Where it is applied to an active matrix light-emitting device, it is preferable that a TFT that is electrically connected to the EL element be an n-channel TFT because it is connected to the cathode 307 (specifically, the transparent electrode 307b). In this case, the manufacturing cost of the light-emitting device can be reduced by making all the TFTs included therein n-channel ones.

Light-emitting devices according to the invention including the above configuration are free of the problem that an external view appears on the observation surface. Capable of solving the problem in the prior art without the need for using an expensive circularly polarizing film, the invention makes it possible to provide inexpensive light-emitting devices. Further, inexpensive electric apparatuses can be provided by using a light-emitting device according to the invention as a display unit.

Embodiment 1

In this embodiment, a low-reflectance metal film (preferably, a titanium film, a titanium nitride film, a chromium film, a molybdenum film, a tungsten film, a tantalum film, or a tantalum nitride film) is used as a light shield film. This embodiment will be described with reference to FIGS. 5A and 5B.

Figure 5A:
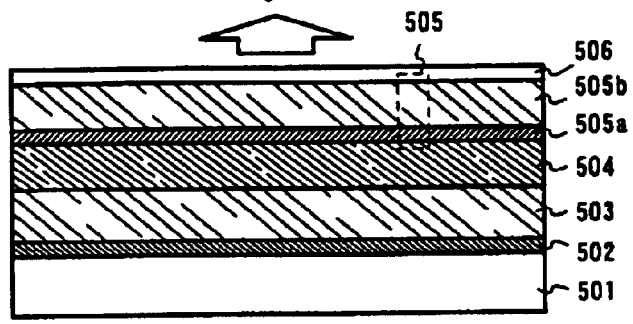
FIGS. 5A and 5B each show the structure of a pixel section of a light-emitting device according to a first embodiment of the invention.

As shown in FIG. 5A, a light shield film 502, an anode 503, an EL layer 504, a cathode 505 consisting of a semitransparent electrode 505a and a transparent electrode 505b, and a protective film 506 are laid one on another on an insulating film 501.

In this embodiment, a silicon nitride film is used as the insulating film 501, a 200-nm-thick chromium film is used as the light shield film 502, a 120-nm-thick oxide conductive film in which gallium oxide is added to zinc oxide is used as the anode 503, a lamination structure of a 20-nm-thick copper phthalocyanine film (hole injection layer) and a 50-nm-thick Alq$_3$ (aluminum quinolinolato complex: light-emitting layer) is used as the EL layer 504, a 20-nm-thick MgAg film (an alloy film formed by coevaporating magnesium and silver) is used as the semitransparent electrode 505a, a 200-nm-thick oxide conductive film in which gallium oxide is added to zinc oxide is used as the transparent electrode 505b; and a diamond-like carbon film is used as the protective film 506.

Figure 5B:
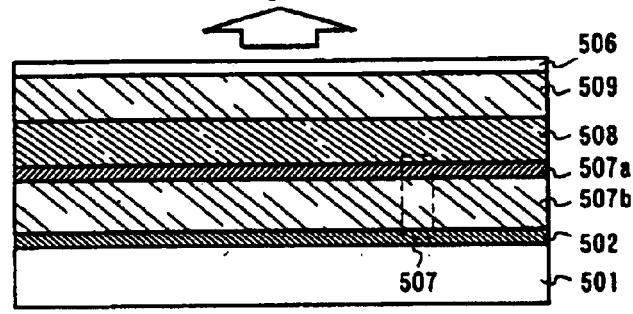

Alternatively, as shown in FIG. 5B, a light shield film 502, a cathode 507 consisting of a transparent electrode 507b and a semitransparent electrode 507a, an EL layer 508, an anode 509, and a protective film 506 are laid one on another on an insulating film 501. The anode 509, EL layer 508, semitransparent electrode 507a, and transparent electrode 507b may be made of the same materials as the anode 503, EL layer 504, semitransparent electrode 505a, and transparent electrode 505b shown in FIG. 5A, respectively.

In the light-emitting devices having the structures of FIGS. 5A and 5B, an external view does not tend to appear on the observation surface because ambient light is absorbed to a certain extent at the surface of the light shield film 502 made of chromium and reflection light is reduced accordingly. Therefore, good image quality can be obtained. Dispensing with an expensive circularly polarizing film, this embodiment provides inexpensive light-emitting devices.

Embodiment 2

In this embodiment, the structure of the cathode is different than in the first embodiment. This embodiment will be described with reference to FIGS. 6A and 6B. Since this embodiment is different from the fundamental embodiment (see FIGS. 3A and 3B and FIGS. 4A and 4B) only in the structure of the cathode, the other components shown in FIGS. 6A and 6B are given the same reference numerals as the corresponding components in FIGS. 3A and 3B and FIGS. 4A and 4B and reference is made to the descriptions that were made above of the corresponding components.

Figure 6A:
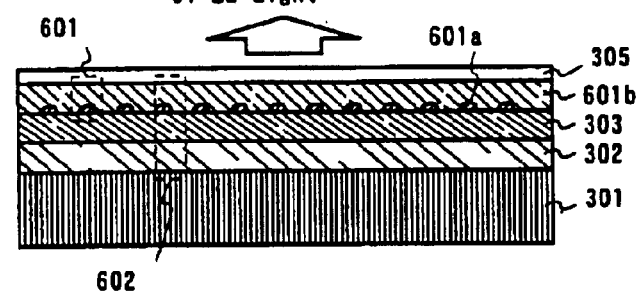
FIGS. 6A and 6B each show the structure of a pixel section of a light-emitting device according to a second embodiment of the invention.
Figure 6B:
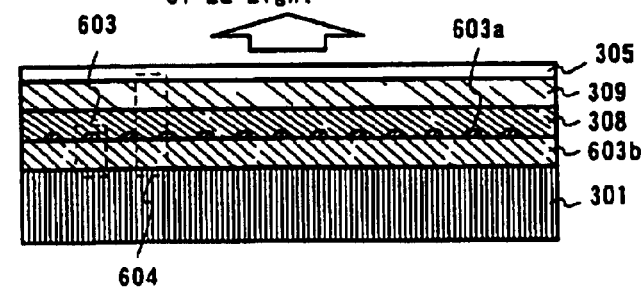

FIG. 6A shows a light-emitting device in which the cathode has a different structure than the cathode 304 shown in FIG. 3B. As shown in FIG. 6A, the cathode 601 consists of a cluster 601a formed on the EL layer 303 and a transparent electrode 601b that is formed so as to cover the cluster 601a. That is, this light-emitting device is characterized in having, as a light-emitting element, an EL element 602 that consists of the anode 302, the EL layer 303, and the cathode 601.

The cluster 601a is a collection of a group-1 or group-2 element in the periodic table and are formed on the EL layer 303 in a dot-like manner or a lump-like manner. In the structure of FIG. 6A, the work function of the cluster 601a determines the electron injection barrier height. Electrons are injected into the EL layer 303 through the cluster 601a.

Naturally, since the cluster 601a is dotted on the EL layer 303, EL light can pass through the cathode 601 traveling between the dots or lumps of the cluster 601a. It is preferable that the diameter or the major-axis diameter of the dots or lumps of the cluster 601a be 10–100 nm and their height be 5–10 nm. As long as the dots or lumps are of such a size, the cluster 601a itself is semitransparent. Such a cluster 601a can be formed by forming a thin film of a group-1 or group-2 element in the periodic table by evaporation in which the target film thickness is set as small as 5–10 nm.

Figure 4B:
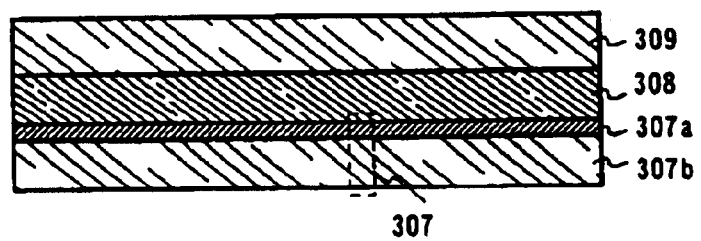

FIG. 6B shows a light-emitting device in which the cathode has a different structure than the cathode 307 shown in FIG. 4B. As shown in FIG. 6B, the cathode 603 consists of a transparent electrode 603b and a cluster 603a formed on the transparent electrode 603b. Therefore, this light-emitting device is characterized in having, as a light-emitting element, an EL element 604 that consists of the cathode 603, the EL layer 308, and the anode 309.

The cluster 603a may be the same as the cluster 601a. In the structure of FIG. 6B, the work function of the cluster 603a determines the electron injection barrier height. Electrons are injected into the EL layer 308 through the cluster 603a.

Embodiment 3

In this embodiment, the structures of the EL layer and the cathode are different than in the first and second embodiments. This embodiment will be described with reference to FIGS. 7A and 7B. Since this embodiment is different from the fundamental embodiment (see FIGS. 3A and 3B and FIGS. 4A and 4B) only in the structures of the EL layer and the cathode, the other components shown in FIGS. 7A and 7B are given the same reference numerals as the corresponding components in FIGS. 3A and 3B and FIGS. 4A and 4B and reference is made to the descriptions that were made above of the corresponding components.

Figure 7A:
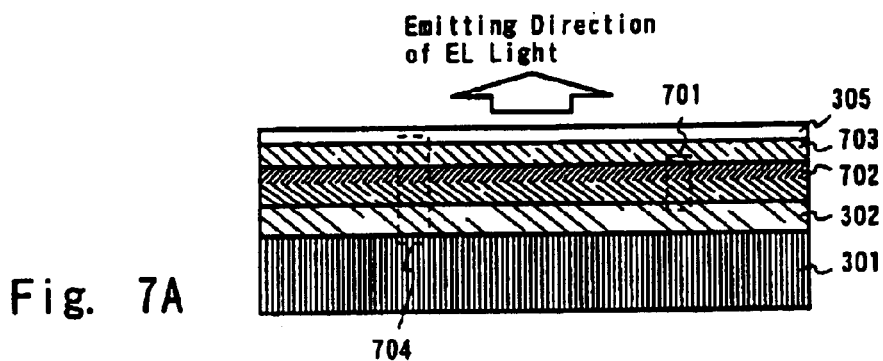
FIGS. 7A and 7B each show the structure of a pixel section of a light-emitting device according to a third embodiment of the invention.
Figure 7B:
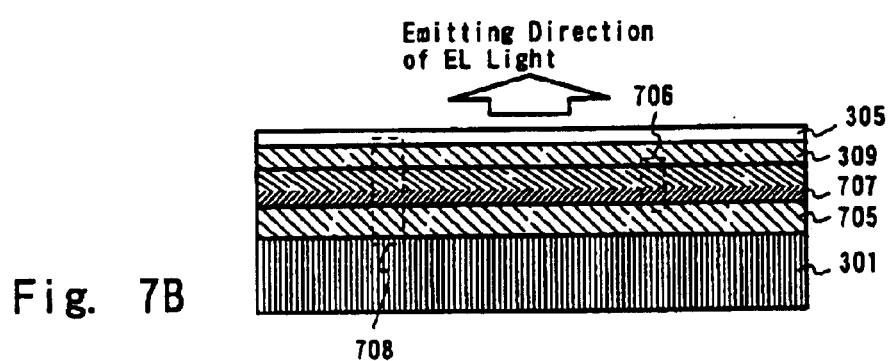

FIG. 7A shows a light-emitting device in which the EL layer and the cathode have different structures than the EL layer 303 and the cathode 304 shown in FIG. 3B. As shown in FIG. 7A, the EL layer 701 has, in the vicinity of the boundary between the EL layer 701 and the cathode 703, a region (hereinafter referred to as "electron injection region") in which a group-1 or group-2 element in the periodic table (in this embodiment, cesium) is added. The electron injection region 702 determines the electron injection barrier height and plays the same role as an electron injection layer.

Examples of the means for adding the group-1 or group-2 element in the periodic table to a portion of the EL layer 303 are a means of adding such an element by coevaporation in forming a light-emitting layer, an electron transport layer, or an electron injection layer, a means of adding such an element by plasma-processing the surface of the EL layer 303, and a means of adding such an element through the cathode 703 by plasma doping or ion implantation.

In adding the group-1 or group-2 element in the periodic table by coevaporation, it is preferable to start the coevaporation of the element as a guest in a state that a light-emitting layer as a host is being formed. This makes the boundary between the electron injection region 702 and the light-emitting layer unclear (continuous) and can produce a junction with a small number of recombination centers.

In this structure, since the electron injection barrier height is determined by the electron injection region 702, the cathode 703 may be an oxide conductive film that is transparent to visible light. Therefore, this light-emitting device is characterized in having, as a light-emitting element, an EL element 704 that consists of the anode 302, the EL layer 701, and the cathode 703.

FIG. 7B shows a light-emitting device in which the EL layer and the cathode have different structures than the EL layer 308 and the cathode 309 shown in FIG. 4B. As shown in FIG. 7B, the EL layer 706 has an electron injection region 707 in the vicinity of the boundary between the EL layer 706 and the cathode 705. Therefore, this light-emitting device is characterized in having, as a light-emitting element, an EL element 708 that consists of the cathode 705, the EL layer 706, and the anode 309.

The electron injection region 707 may be formed by adding a group-1 or group-2 element by coevaporation in forming a light-emitting layer. It is preferable that the group-1 or group-2 element be added in such a manner that the coevaporation of the element as a guest is stopped in a state that a light-emitting layer as a host is being formed. This makes the boundary between the electron injection region 707 and the light-emitting layer unclear (continuous) and can produce a junction with a small number of recombination centers.

Embodiment 4

In this embodiment, specific examples of the EL layers that were described above with reference to FIGS. 1A and 1B, 3A and 3B. 4A and 4B, 5A and 5B, 6A and 6B, and 7A and 7B will be described. Therefore, a light-emitting device according to this embodiment can be combined with any of the configurations described in the Summary of the Invention section and the configurations according to the fundamental embodiment and the first to third embodiments. In this embodiment, an anode 801 may be an oxide conductive film and a cathode 807 may be any of the conductive films described above with reference to FIGS. 3A and 3B or FIGS. 6A and 6B.

Figure 8A:
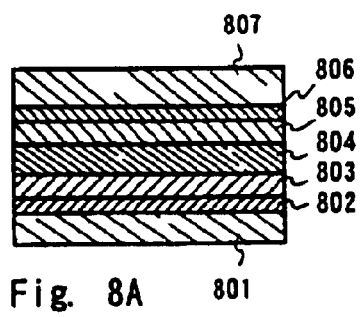
FIGS. 8A–8D show the structures of EL elements of light-emitting devices according to a fourth embodiment of the invention, respectively.

FIG. 8A shows a light-emitting device in which a hole injection layer 802, a hole transport layer 803, a light-emitting layer 804, an electron transport layer 805, and an electron injection layer 806 are laid one on another on an anode 801 and a cathode 807 is formed on the above lamination structure.

Figure 8B:
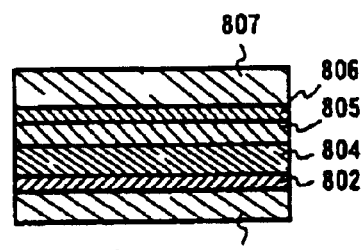

FIG. 8B shows a light-emitting device in which a hole injection layer 802, a light-emitting layer 804, an electron transport layer 805, and an electron injection layer 806 are laid one on another on an anode 801 and a cathode 807 is formed on the above lamination structure.

Figure 8C:
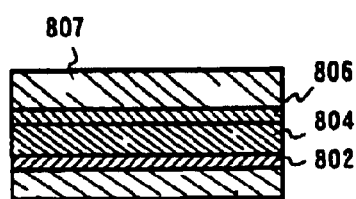

FIG. 8C shows a light-emitting device in which a hole injection layer 802, a light-emitting layer 804, and an electron injection layer 806 are laid one on another on an anode 801 and a cathode 807 is formed on the above lamination structure.

Figure 8D:
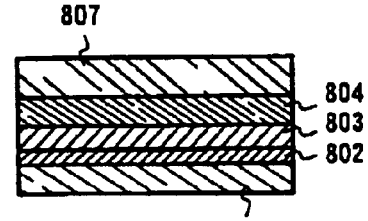

FIG. 8D shows a light-emitting device in which a hole injection layer 802, a hole transport layer 803, and a light-emitting layer 804 are laid one on another on an anode 801 and a cathode 807 is formed on the above lamination structure.

The above structures are just examples, and the structure of the EL layer that can be used in the invention is not limited to the above structures.

Embodiment 5

A passive matrix light-emitting device according to a fifth embodiment of the invention will be described with reference to FIGS. 9A and 9B.

Figure 9A:
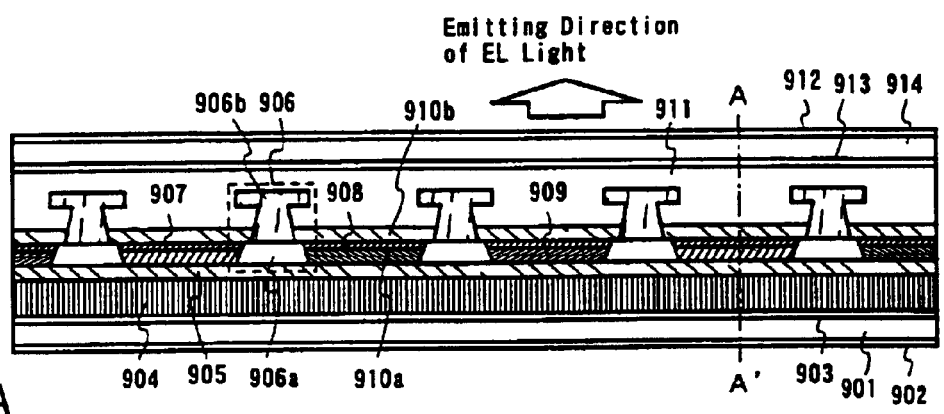
FIGS. 9A and 9B are sectional views showing the structure of a light-emitting device according to a fifth embodiment of the invention.

As shown in FIG. 9A, carbon films (specifically, diamond-like carbon films) 902 and 903 are formed on both surfaces of a plastic film 901. The carbon films 902 and 903 may be formed on the plastic film 901 by the roll-to-roll method.

Reference numeral 904 denotes a 300-nm-thick acrylic resin film that is dispersed with carbon particles. The acrylic resin film 904 dispersed with carbon particles may contain a hygroscopic substance or a deoxidizing substance. This makes it possible to capture water or oxygen that would otherwise reach the EL element.

Anode electrodes 905 that are oxide conductive films (ITO films) made of a compound of indium oxide and tin oxide are formed in stripes on the acrylic resin film 904. Banks (also called cathode partitions) 906 each consisting of a silicon oxide film 906a and a polyimide film 906b are formed on the anodes 905.

The banks 906 may contain a hygroscopic substance or a deoxidizing substance. This makes it possible to capture water or oxygen that would otherwise reach the EL element.

EL layers 907–909 that are separated by the banks 906 are also formed on the anodes 905. Cathode 910 is formed on the EL layers 907–909 by laying a semitransparent electrode 910a that is a 20-nm-thick MgAg film and a transparent electrode 910b that is an ITO film one on another. The EL layers 907–909 are EL layers that emit red light, green light, and blue light, respectively. The EL layers 907–909 may be known ones.

Reference numeral 911 denotes a resin film that is transparent to visible light. The resin film 911 may be made of an ultraviolet curable resin or an epoxy resin. A plastic film 914 on which carbon films 912 and 913 are formed is bonded with the resin film 911. The resin film 911 and the plastic film 914 that is covered with the carbon films 912 and 913 serve as sealing members for protecting the EL element from oxygen and water.

Figure 9B:
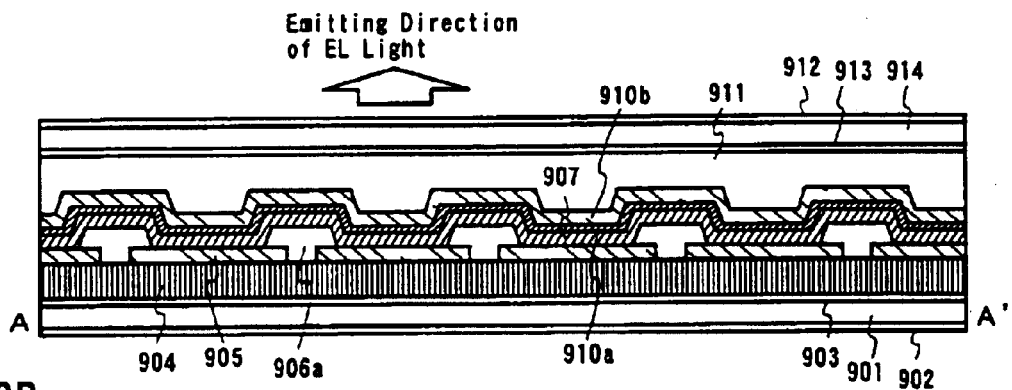

FIG. 9B is a sectional view taken along line A–A' in FIG. 9A. The reference symbols used in FIG. 9B are the same as in FIG. 9A.

The passive matrix light-emitting device according to this embodiment can greatly decrease the degree of the problem that an external view appears on the observation surface without the need for providing a circularly polarizing film on the observation surface. Not only can the price of the light-emitting device be reduced by virtue of not using an expensive circularly polarizing film, but also good image quality can be obtained.

The light-emitting device according to this embodiment can be combined with any of the configurations described in the Summary of the Invention section and the configurations according to the fundamental embodiment and the first to fifth embodiments.

Embodiment 6

An active matrix light-emitting device according to a sixth embodiment of the invention will be described with reference to FIGS. 10A and 10B. The structure of a pixel of a pixel section of the active matrix light-emitting device will be described in this embodiment.

Figure 10A:
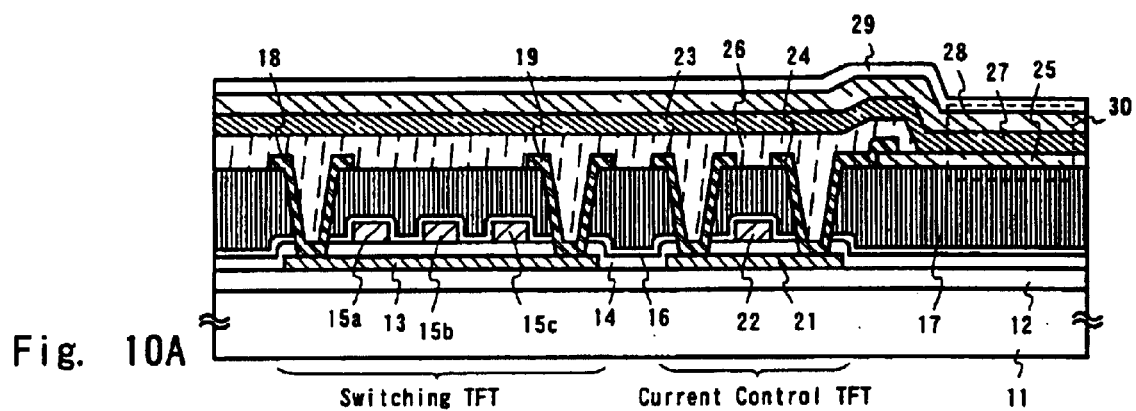
FIGS. 10A and 10B show a sectional structure and a circuit configuration, respectively, of a light-emitting device according to a sixth embodiment of the invention.

In FIG. 10A, a substrate 11 may be a glass substrate, a quartz substrate, a plastic substrate (including a plastic film), a metal substrate, a semiconductor substrate, or a ceramic substrate. An insulating film containing silicon (typically, a silicon oxide film, a silicon oxynitride film, or a silicon nitride film) is formed on the substrate 11 as an undercoat film 12.

A switching TFT 1001 and a current control TFT 1002 are formed on the undercoat film 12. The switching TFT 1001 and the current control TFT 1002 may be either an n-channel TFT or a p-channel TFT.

However, where the current control TFT 1002 is connected to the anode side of the EL element, it is preferable that the current control TFT 1002 be a p-channel TFT. Where the current control TFT 1002 is connected to the cathode side of the EL element, it is preferable that the current control TFT 1002 be an n-channel TFT. In each of the above cases, it is preferable that the conductivity type of the switching TFT 1001 be the same as that of the current control TFT 1002.

The switching TFT 1001 according to this embodiment includes an active layer 13, a gate insulating film 14, gate electrodes 15a–15c, a first interlayer insulating film 16, a light shield film (second interlayer insulating film) 17, a source line 18 and a drain line 19.

The current control TFT 1002 according to this embodiment includes an active layer 21, a gate insulating film 14, a gate electrode 22, a first interlayer insulating film 16, a light shield film (second interlayer insulating film) 17, a source line 23 and a drain line 24.

In this embodiment, the light shield film 17, which is an important feature of the invention, is used as an interlayer insulating film. The light shield film 17 is a polyimide film that is dispersed with carbon particles. The light-shield film 17 may contain a hygroscopic substance or a deoxidizing substance. This makes it possible to capture water or oxygen that would otherwise reach the EL element.

To prevent electrostatic breakdown of the TFTs in forming the light shield film 17, it is effective to adjust the amount of addition or the particle diameter of metal particles or carbon particles so that the resistivity of the light shield film 17 becomes $1 \times 10^6$ to $1 \times 10^{12}$ Ω·m (preferably, $1 \times 10^8$ to $1 \times 10^{10}$ Ω·m). Although in the structure of FIG. 10A the light shield film 17 is formed on the first interlayer insulating film 16, a lamination structure may be formed by the light shield film 17 and a resin film that is transparent to visible light.

The drain line 19 of the switching TFT 1001 is connected to the gate electrode 22 of the current control TFT 1002. The drain line 24 of the current control TFT 1002 is connected to a pixel electrode 25. The pixel electrode 25 serves as the anode or cathode of an EL element 30. In this embodiment, the pixel electrode 25 serves as the anode.

Reference numeral 26 denotes a bank that is an insulating film provided for preventing a direct contact between the EL layer 27 and the edge of the pixel electrode 25. It is preferable that the bank 26 be an insulating film containing silicon or a resin film. Alternatively, the bank 26 may be an insulating film that is dispersed with metal particles or carbon particles. In this case, to prevent electrostatic breakdown of the TFT's, it is desirable to adjust the amount of addition of metal particles or carbon particles so that the resistivity of the insulating film becomes $1 \times 10^6$ to $1 \times 10^{12}$ Ω·m (preferably, $1 \times 10^8$ to $1 \times 10^{10}$ Ω·m).

The bank 26 may contain a hygroscopic substance or a deoxidizing substance. This makes it possible to capture water or oxygen that would otherwise reach the EL element.

Reference numeral 27 denotes an EL layer and numeral 28 denotes an electrode that is transparent to visible light. In this embodiment, the electrode 28 is the cathode because the pixel electrode 25 is the anode. Therefore, the EL element 30 has the structure shown in FIGS. 3A and 3B, 5A, 6A, or 7A.

If the pixel electrode 25 were the cathode, the electrode 28 should be the anode. In this case, the EL element 30 would have the structure shown in FIGS. 4A and 4B, 5B, 6B, or 7B.

A passivation film 29 is formed so as to cover the EL element 30 consisting of the pixel electrode 25, the EL layer 27, and the electrode 28. The passivation film 29 may be an insulating film similar to the protective film 35 that was described in the Summary of Invention Section.

Figure 10B:
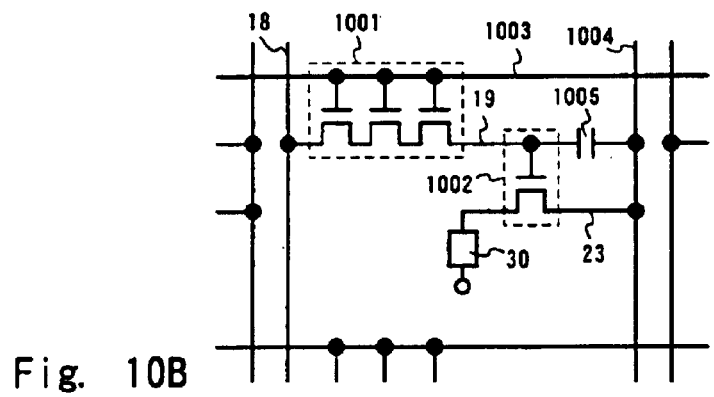

FIG. 10B shows a circuit configuration of the pixel shown in FIG. 10A. In FIG. 10B, reference numeral 1003 denotes a gate line for applying a gate voltage to the gate electrodes 15a–15c of the switching TFT 1001 and reference numeral 1004 denotes a current supply line for supplying a current to flow through the EL element 30. A capacitor 1005 is provided to hold a gate voltage to be applied to the gate electrode 22 of the current control TFT 1002.

The light-emitting device according to this embodiment can be combined with any of the configurations described in the Summary of the Invention section and the configurations according to the fundamental embodiment and the first to fifth embodiments.

Embodiment 7

Figure 11:
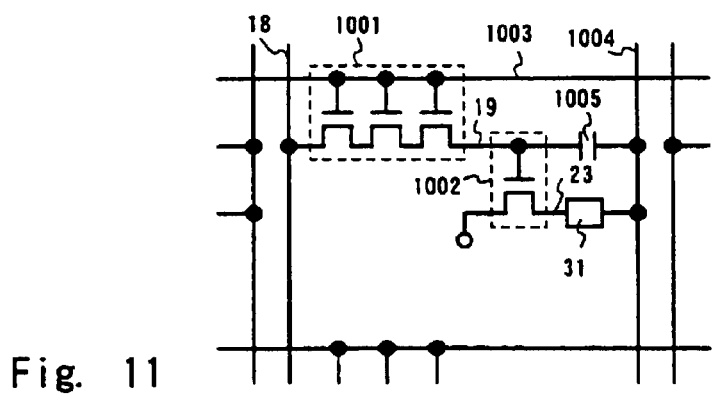
FIG. 11 shows a circuit configuration of a light-emitting device according to a seventh embodiment of the invention.

In this embodiment, each pixel is configured so as to have a circuit configuration shown in FIG. 11 that is different from the circuit configuration shown in FIG. 10B. In the circuit configuration of FIG. 11, an EL element 31 is provided between the current supply line 1004 and the current control TFT 1002.

The light-emitting device according to this embodiment can be combined with any of the configurations described in the Summary of the Invention section and the configurations according to the fundamental embodiment and the first to fifth embodiments.

Embodiment 8

An active matrix light-emitting device according to an eighth embodiment of the invention in which a pixel section and a driver circuit for transmitting signals to the pixel section are formed on the same substrate will be described with reference to FIG. 12. For the circuit configuration of each pixel, refer to FIG. 10B.

Figure 12:
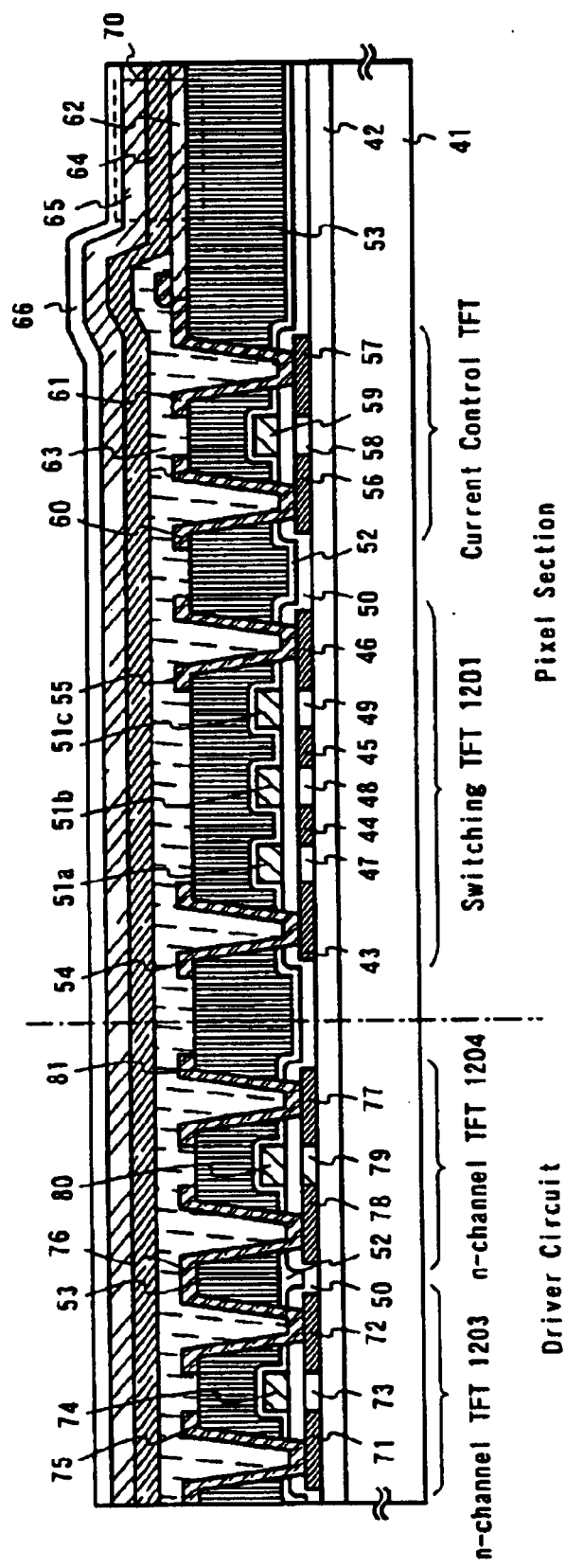
FIG. 12 shows a sectional structure of a light-emitting device according to an eighth embodiment of the invention.

As shown in FIG. 12, an undercoat film 42 that is a silicon oxynitride film is formed on a glass substrate 41. A switching TFT 1201, a current control TFT 1202, and n-channel TFTs 1203 and 1204 are formed on the undercoat film 42. The switching TFT 1201 and the current control TFT 1202 are example TFTs provided in the pixel section and the n-channel TFTs 1203 and 1204 are example TFTs provided in the driver circuit.

First, the pixel section will be described. The switching TFT 1201, which is an n-channel TFT, includes an active layer that includes a source region 43, an isolation region (i.e., an impurity region existing between channel forming regions) 44, an isolation region 45, a drain region 46, and channel forming regions 47–49, a gate insulating film 50 that is a silicon oxynitride film, gate electrodes 51a–51c that are tungsten films, a first interlayer insulating film 52 that is a silicon nitride film, a light shield film 53 that is an acrylic resin film dispersed with carbon particles, and a source line 54 and a drain line 55 that are aluminum alloy films. The light shield film 53 contains carbon particles so as to have resistivity of $1 \times 10^8$ to $1 \times 10^{10}$ Ω·m.

The light shield film 53 may contain a hygroscopic substance or a deoxidizing substance. This makes it possible to capture water or oxygen that would otherwise reach the EL element.

The current control TFT 1202, which is an n-channel TFT, includes an active layer that includes a source region 56, a drain region 57, and a channel forming region 58, a gate insulating film 50 that is a silicon oxynitride film, a gate electrode 59 that is a tungsten film, a first interlayer insulating film 52 that is a silicon nitride film, a light shield film 53 that is an acrylic resin film dispersed with carbon particles, and a source line 60 and a drain line 61 that are aluminum alloy films.

The drain line 55 of the switching TFT 1201 is connected to the gate electrode 59 of the current control TFT 1202. The drain line 61 of the current control TFT 1202 is connected to a pixel electrode 62. The pixel electrode 62 serves as the cathode of an EL element 70. Therefore, the EL element 70 has the structure shown in FIGS. 4A and 4B, 5B, 6B, or 7B.

Reference numeral 63 denotes a bank that is an acrylic resin film that is dispersed with carbon particles. Like the light shield film 53, the bank 63 contains carbon particles so as to have resistivity of $1 \times 10^8$ to $1 \times 10^{10}$ Ω·m. The bank 63 may contain a hygroscopic substance or a deoxidizing substance. This makes it possible to capture water or oxygen that would otherwise reach the EL element.

Reference numeral 64 denotes an EL layer formed by laying a lithium oxide (LiO) film and a polyvinyl carbazole (PVK) in this order from the side adjacent to the cathode 62. Reference numeral 65 denotes an anode that is an oxide conductive film.

A passivation film 66 that is a carbon film (specifically, a diamond-like carbon film) is formed so as to cover the EL element 70 consisting of the pixel electrode (cathode) 62, the EL layer 64, and the anode 65.

Next, the driving circuit will be described. The n-channel TFT 1203 includes an active layer including a source region 71, a drain region 72, and a channel forming region 73, a gate insulating film 50 that is a silicon oxynitride film, a gate electrode 74 that is a tungsten film, a first interlayer insulating film 52 that is a silicon nitride film, a light shield film 53 that is an acrylic resin film dispersed with carbon particles, and a source line 75 and a drain line 76 that are aluminum alloy films.

The n-channel TFT 1204 includes an active layer including a source region 77, a drain region 78, and a channel forming region 79, a gate insulating film 50 that is a silicon oxynitride film, a gate electrode 80 that is a tungsten film, a first interlayer insulating film 52 that is a silicon nitride film, a light shield film 53 that is an acrylic resin film dispersed with carbon particles, and a source line 81 and the drain line 76 (common to the n-channel TFT 1203) that are aluminum alloy films.

It is effective to extend the bank 63 that is provided in the pixel section, so as to exist also in the driver circuit. Since the driver circuit is an area that does not influence image display, it is possible to form, over a wide area, an insulating film containing a hygroscopic substance or a deoxidizing substance. This makes it possible to effectively capture water or oxygen that would otherwise reach the EL element.

Although all the TFTs used in this embodiment are enhancement-type n-channel TFTs, one of the n-channel TFT 1203 and the n-channel TFT 1204 may be of a depletion type. In this case, enhancement-type TFTs and depletion-type TFTs can be formed at desired positions by adding phosphorus or boron selectively to semiconductor portions to become channel forming regions.

Where an NMOS transistor is formed by combining the n-channel TFT 1203 and the n-channel TFT 1204, it is formed by enhancement-type TFTs (hereinafter referred to as "EEMOS transistor") or by an enhancement-type TFT and a depletion-type TFT (hereinafter referred to as "EDMOS transistor").

Figure 13A:
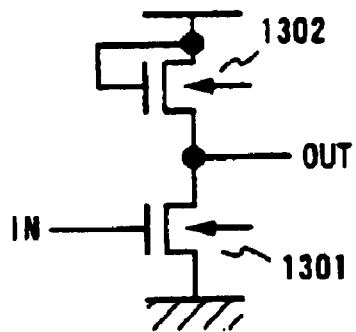
FIGS. 13A and 13B show circuit configurations of NMOS transistors.
Figure 13B:
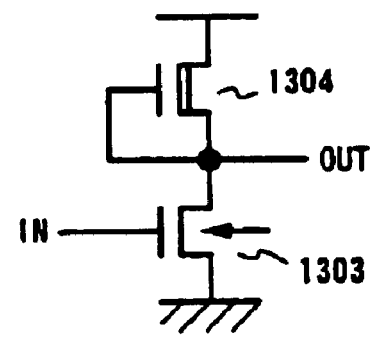

FIGS. 13A and 13B show exemplary EEMOS and EDMOS transistors, respectively. In FIG. 13A, reference numerals 1301 and 1302 denote enhancement-type n-channel TFTs. In FIG. 13B, reference numerals 1303 and 1304 denote an enhancement-type TFT and a depletion-type TFT, respectively.

Figure 14:
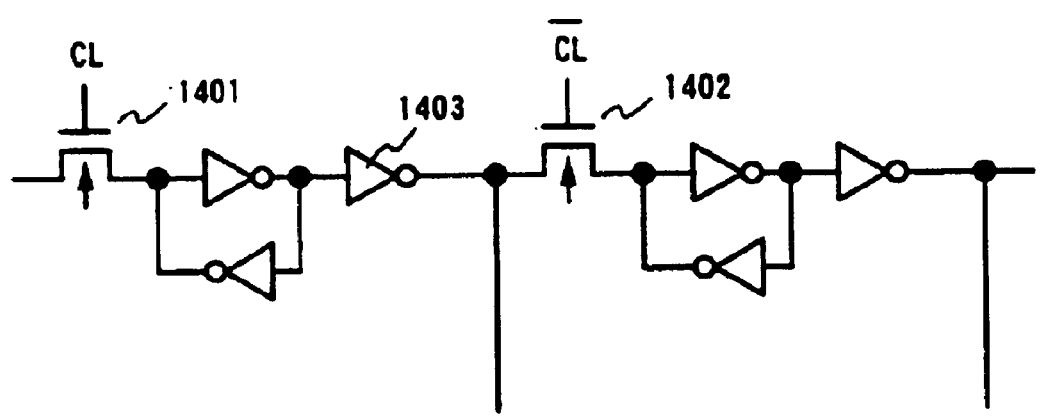
FIG. 14 shows a circuit configuration of a shift register formed by using NMOS transistors.

FIG. 14 shows a shift register formed by using the EEMOS transistor shown in FIG. 13A or the EDMOS transistor shown in FIG. 13B. In FIG. 14, reference numerals 1401 and 1402 denote enhancement-type n-channel TFTs to which clock signals having opposite polarities are input. Reference numeral 1403 denotes an inverter formed by NMOS transistors that are EEMOS transistors as shown in FIG. 13A or EDMOS transistors as shown in FIG. 13B.

By forming all the TFTs as n-channel TFTs as in the case of this embodiment, the manufacturing process of a light-emitting device can be simplified and its manufacturing cost can be reduced. Where TFTs are formed on a plastic substrate (including a plastic film), the use of n-channel TFTs improves the performance of a light-emitting device because n-channel TFTs exhibit better electrical characteristics than p-channel TFTs.

The light-emitting device according to this embodiment can be combined with any of the configurations described in the Summary of the Invention section and the configurations according to the fundamental embodiment and the first to fifth embodiments.

Embodiment 9

In this embodiment, the entire configuration of the above-described active matrix light-emitting device according to the eighth embodiment will be described. For the components that are given the same reference symbols as in the eighth embodiment, refer to the corresponding descriptions in the eighth embodiment.

In FIG. 15A, reference numeral 1501 denotes a gate-side driver circuit, numeral 1502 denotes a source-side (data-side) driver circuit, and numeral 1503 denotes a pixel section. Signals to be transmitted to the gate-side driver circuit 1501 and the source-side driver circuit 1502 are supplied from an FPC (flexible printed circuit) 1505 via an input wiring 1504.

Reference numeral 1506 denotes a sealing member (in this embodiment, a plastic film) for sealing the EL element 70, and reference numeral 1507 denotes a sealing resin for sealing the end portion of the sealing member 1506.

FIG. 15B is a sectional view taken along line A–A' in FIG. 15A. As shown in FIG. 15B, the front surface and the back surface of the sealing member 1506 are covered with carbon films (specifically, diamond-like carbon films) 1508a and 1508b, respectively. This integral member is bonded, with a resin adhesive 1509 to a substrate 41 on which the TFTs and the EL element 70 are formed. Further, the end portion of the integral member is sealed with the sealing resin 1507. At this time, it is possible to cover part of the FPC 1505 with the sealing resin 1507.

In this embodiment, since the EL element 70 is protected from oxygen and water by means of the passivation film 66, the adhesive 1509, and the plastic film 1506 (including the carbon films 1508a and 1508b), the light-emitting device can be made highly reliable.

Embodiment 10

Figure 18:
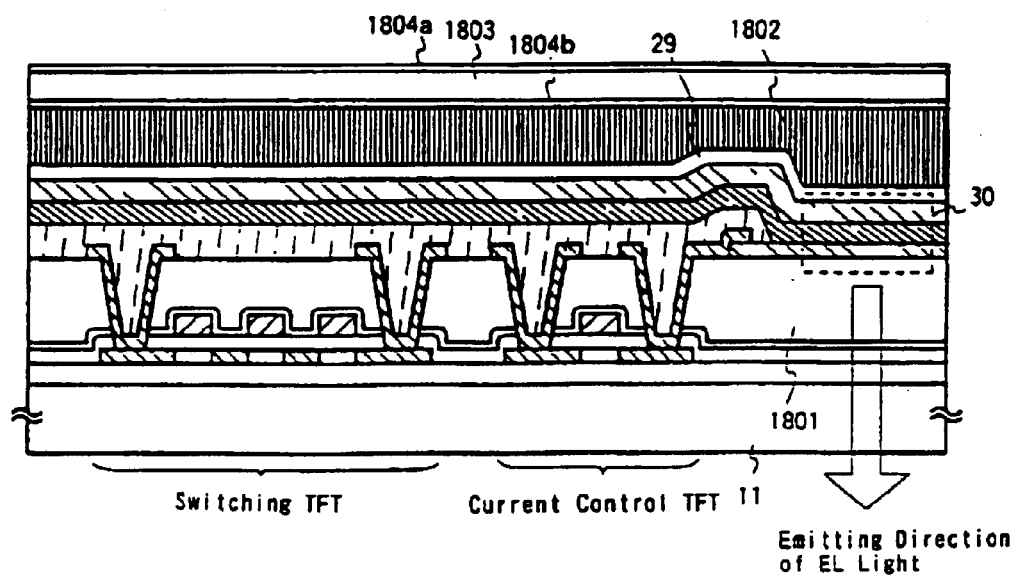
FIG. 18 shows a sectional structure of a light-emitting device according to a 10th embodiment of the invention.

A light-emitting device according to a 10th embodiment in which a light shield film for absorbing light (EL light) emitted from an EL element is provided above the EL element will be described with reference to FIG. 18. This embodiment is a modified version of the active matrix light-emitting device according to the sixth embodiment. In this embodiment, only the points that are different in structure than in the embodiment shown in FIG. 10A will be described.

In this embodiment, first, the substrate 11 is made of a material that is transparent to visible light. Therefore, the substrate 11 may be a glass substrate, a quartz substrate, or a plastic substrate (including a plastic film).

A resin film 1801 that is transparent to visible light is used as an interlayer insulating film in place of the light shield film 17 shown in FIG. 10A.

The most remarkable feature is that a light shield film 1802 is formed on the passivation film 29. The light shield film 1802 may be made of the same material as the light shield film 17 or an epoxy resin film containing metal particles or carbon particles.

Further, in this embodiment, a plastic film 1803 is bonded to the light shield film 1802. In this embodiment, the plastic film 1803 is protected by carbon films (specifically, diamond-like carbon films) 1804a and 1804b to prevent passage of water and oxygen.

This embodiment enables use, as an interlayer insulating film, of the resin film 1801 that has high resistance and hence is high in insulation performance, thereby enhancing the device isolation effect. It is noted that light that is emitted upward from the EL element 30 is absorbed by the light shield film 1802 and light that is emitted downward from the EL element 30 produces an image.

The configuration of this embodiment can be combined with any of the configurations of the first to fourth embodiments and the seventh to ninth embodiments.

Embodiment 11

Being of a self-emission type, light-emitting devices produced by practicing the invention are superior in legibility at bright places to and have a wider viewing angle than liquid crystal display devices. Therefore, light-emitting devices according to the invention can be used as the display unit of various kinds of electric apparatuses.

Examples of electric apparatuses according to the invention are video cameras, digital cameras, goggles-type displays (head-mounted displays), car navigation systems, car audio apparatuses, notebook-sized personal computers, game machines, personal digital assistants (mobile computers, cellular phones, portable game machines, and electronic books), and image reproducing apparatuses (specifically, apparatuses that reproduce information on a recording medium such as a compact disc (CD), a laser disc (LD), or a digital versatile disc (DVD) and has a display capable of displaying a resulting image). FIGS. 16A–16F and 17A and 17B show specific examples of those electric apparatuses.

Figure 16A:
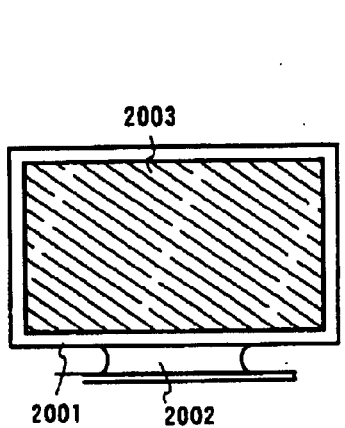
FIGS. 16A–16F show specific examples of electric apparatuses according to the invention.

FIG. 16A shows an EL display that includes a body 2001, a support stage 2002, and a display unit 2003. A light-emitting device according to the invention can be used in the display unit 2003. Being of a self-emission type, EL displays do not require a backlight and hence their display unit can be made thinner than in liquid crystal displays.

Figure 16B:
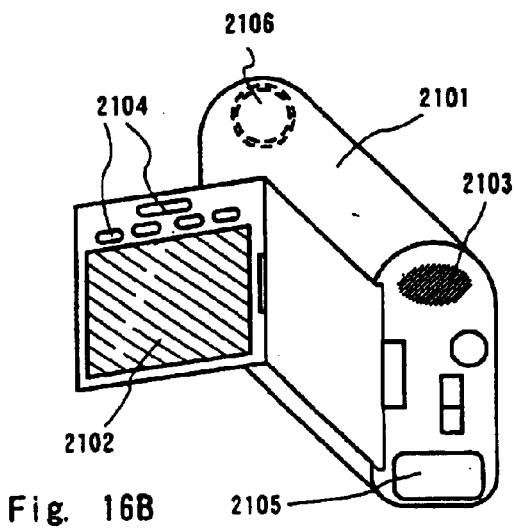

FIG. 16B shows a video camera that includes a main body 2101, a display unit 2102, a sound input section 2103, a manipulation switches 2104, a battery 2105, and an image receiving section 2106. A light-emitting device according to the invention can be used in the display unit 2102.

Figure 16C:
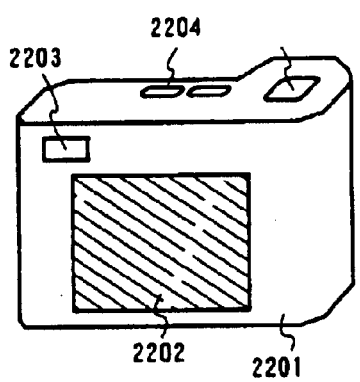

FIG. 16C shows a digital camera that includes a main body 2201, a display unit 2202, an eyepiece section 2203, and manipulation switches 2204. A light-emitting device according to the invention can be used in the display unit 2202.

Figure 16D:
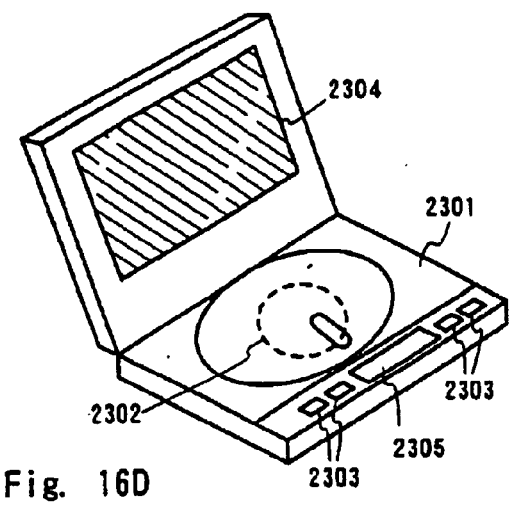

FIG. 16D shows an image reproducing apparatus having a recording medium (specifically, a DVD reproducing apparatus) that includes a main body 2301, a recording medium (CD, LD or DVD) 2302, manipulation switches 2303, a display unit (a) 2304, and a display unit (b) 2305. Reference numeral 2302 denotes a recording medium (DVD). The display unit (a) mainly displays image information and the display unit (b) mainly displays text information. A light-emitting device according to the invention can be used in the display unit (a) 2304 and a display unit (b) 2305. Image reproducing apparatuses having the recording medium can include CD reproducing apparatuses and game machines.

Figure 16E:
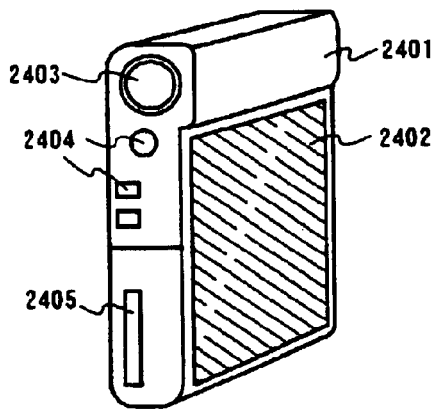

FIG. 16E shows a mobile computer that includes a main body 2401, a display unit 2402, an image receiving section 2403, manipulation switches 2404, and a memory slot 2405. A light-emitting device according to the invention can be used in the display unit 2402. This mobile computer can record information on a recording medium formed by integrating flash memories or nonvolatile memories and reproducing such information.

Figure 16F:
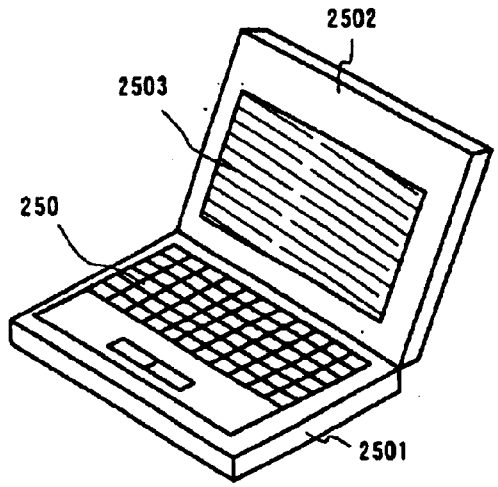

FIG. 16F shows a personal computer that consists of a main body 2501, a body 2502, a display unit 2503, and a keyboard 2504. A light-emitting device according to the invention can be used in the display unit 2503.

If the luminance of EL materials is increased sufficiently in the future, it will become possible to use EL light-emitting devices as front and rear projectors by enlarging and projecting light that carries image information that is output from those devices by a lens etc.

Electric apparatuses of the above kind have come to display more frequently information, particularly moving picture information, that is distributed over an electronic communication network such as the Internet and a CATV (cable television). EL light-emitting devices are suitable for such moving picture display because EL materials exhibit very high response speeds.

In light-emitting devices, it is desirable to display information in such a manner that the light-emitting section is minimized because it consumes power. Where a light-emitting device according to the invention is used in the display unit of portable digital assistants, particularly ones in which text information is displayed mainly as in the case of cellular phones and car audio apparatuses, it is desirable that the driving be so performed that text information is displayed by using light-emitting portions with non-light-emitting portions used as a background.

Figure 17A:
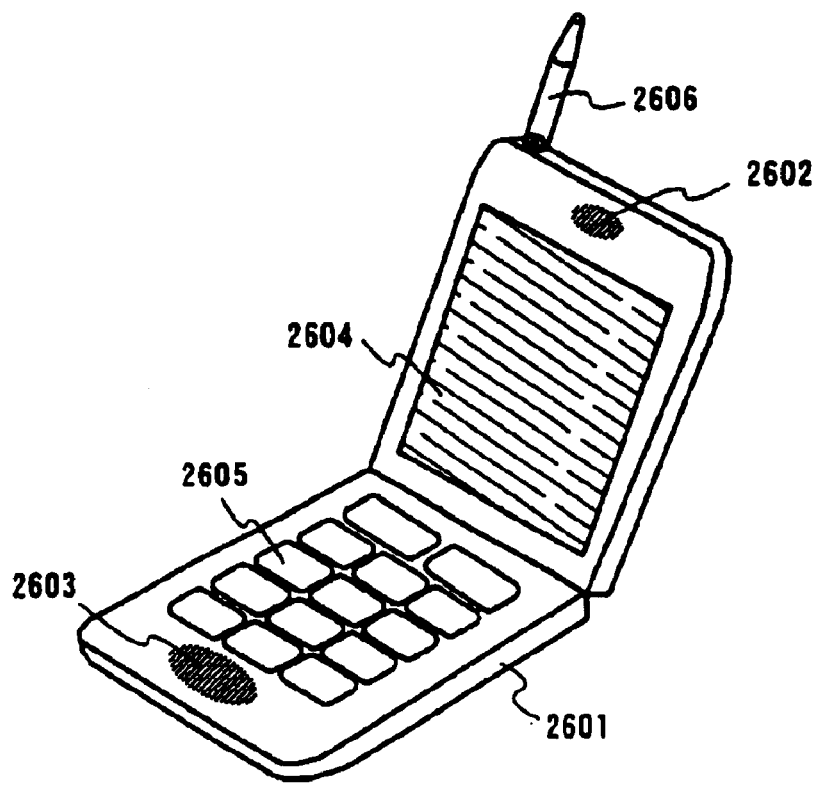
FIGS. 17A and 17B show other specific examples of electric apparatuses according to the invention.

FIG. 17A shows a cellular phone that includes a main body 2601, a sound output section 2602, a sound input section 2603, a display unit 2604, manipulation switches 2605, and an antenna 2606. A light-emitting device according to the invention can be used in the display unit 2604. The power consumption of the cellular phone can be reduced by the display unit 2604's displaying white characters against a black background.

Figure 17B:
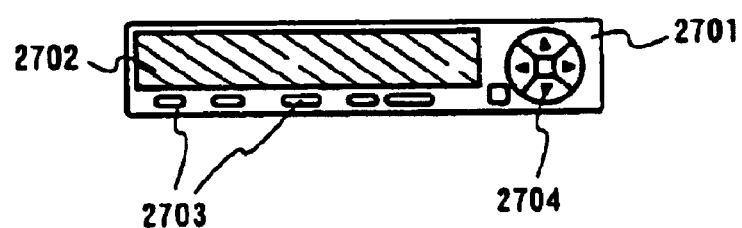

FIG. 17B shows a car audio apparatus that includes a main body 2701, a display unit 2702, and manipulation switches 2703 and 2704. A light-emitting device according to the invention can be used in the display unit 2702. Although the car audio apparatus according to this embodiment is a vehicular one, a light-emitting device according to the invention may be used in a stationary car audio apparatus. The power consumption can be reduced by the display unit 2704's displaying white characters against a black background.

It is effective to give electric apparatuses according to the invention a function of modulating the luminance in accordance of the brightness of a use environment by providing a means for detecting the brightness of a use environment (incorporating a photosensor). Users can recognize an image or text information without any problem if brightness corresponding to a contrast ratio of 100–150 with respect to the brightness of a use environment is secured. It is possible to increase the luminance of an image to make it more legible when the use environment is bright, and to decrease the luminance of an image to reduce the power consumption when the use environment is dark.

As described above, the application range of the invention is very broad and the invention can be applied to electric apparatuses of every field. Electric apparatuses according to the invention can be obtained by using a light-emitting device produced by freely combining the configurations of the first to 10th embodiments.

Practicing the invention makes it possible to solve the problem that an external view appears on the observation surface without the need for using an expensive circularly polarizing film. Therefore, light-emitting devices that are inexpensive and have good image quality can be obtained. Inexpensive electric apparatuses using an inexpensive light-emitting device as a display unit can also be obtained.

What is claimed is:

1. A light-emitting device comprising:
    an electroluminescence element comprising an anode, a cathode, and an electroluminescence layer between said anode and said cathode, formed over a substrate; and
    a light shield film in contact with said electroluminescence element, formed over said substrate,
    wherein said cathode comprises a first layer in contact with said electroluminescence layer and a second layer in contact with said first layer, and
    wherein said first layer comprises a metal containing a group-1 or group-2 element in the periodic table, and said second layer comprises an oxide conductive film.

2. The light-emitting device according to claim 1, wherein said light shield film is a film selected from the group consisting of an insulating film dispersed with metal particles or carbon particles, a titanium film, a titanium nitride film, a chromium film, a molybdenum film, a tungsten film, a tantalum film, or a tantalum nitride film, and a semiconductor film.

3. The light-emitting device according to claim 1, wherein said anode is an oxide conductive film.

4. The light-emitting device according to claim 1, wherein said first layer is 5–70 nm in thickness.

5. The light-emitting device according to claim 1, wherein at least one thin film transistor formed over said substrate is electrically connected to said anode or said cathode.

6. A camera comprising:
    an electroluminescence element comprising an anode, a cathode, and an electroluminescence layer between said anode and said cathode, formed over a substrate; and
    a light shield film in contact with said electroluminescence element, formed over said substrate,
    wherein said cathode comprises a first layer in contact with said electroluminescence layer and a second layer, and
    wherein said first layer comprises a metal containing a group-1 or group-2 element in the periodic table, and said second layer comprises an oxide conductive film.

7. A camera according to claim 6, wherein at least one thin film transistor formed over said substrate is electrically connected to said anode or said cathode.

8. A camera according to claim 6, said light shield film is a film selected from the group consisting of an insulating film dispersed with metal particles or carbon particles, a titanium film, a titanium nitride film, a chromium film, a molybdenum film, a tungsten film, a tantalum film, or a tantalum nitride film, and a semiconductor film.

9. A camera according to claim 6, wherein said first layer is 5–70 nm in thickness.

10. An image reproducing apparatus comprising:
    an electroluminescence element comprising an anode, a cathode, and an electroluminescence layer between said anode and said cathode, formed over a substrate; and
    a light shield film in contact with said electroluminescence element, formed over said substrate,
    wherein said cathode comprises a first layer in contact with said electroluminescence layer and a second layer in contact with said light shield film,
    wherein said first layer comprises a metal containing a group-1 or group-2 element in the periodic table, and said second layer comprises an oxide conductive film.

11. An image reproducing apparatus according to claim 10, wherein at least one thin film transistor formed over said substrate is electrically connected to said cathode or said anode.

12. An image reproducing apparatus according to claim 10, said light shield film is a film selected from the group consisting of an insulating film dispersed with metal particles or carbon particles, a titanium film, a titanium nitride film, a chromium film, a molybdenum film, a tungsten film, a tantalum film, or a tantalum nitride film, and a semiconductor film.

13. An image reproducing apparatus according to claim 10, wherein said first layer is 5–70 nm in thickness.

14. A mobile computer comprising:
   an electroluminescence element comprising an anode, a cathode, and an electroluminescence layer between said anode and said cathode, formed over a substrate; and
   a light shield film in contact with said electroluminescence element, formed over said substrate,
   wherein said cathode comprises a first layer in contact with said electroluminescence layer and a second layer in contact with said light shield film, and
   wherein said first layer comprises a metal containing a group-1 or group-2 element in the periodic table, and said second layer comprises an oxide conductive film.

15. A mobile computer according to claim 14, wherein at least one thin film transistor formed over said substrate is electrically connected to said anode or said cathode.

16. A mobile computer according to claim 14, said light shield film is a film selected from the group consisting of an insulating film dispersed with metal particles or carbon particles, a titanium film, a titanium nitride film, a chromium film, a molybdenum film, a tungsten film, a tantalum film, or a tantalum nitride film, and a semiconductor film.

17. A mobile computer according to claim 14, wherein said first layer is 5–70 nm in thickness.

18. A mobile computer according to claim 14, wherein said light-emitting device is incorporated into an electronic apparatus selected from the group consisting of an EL display, a video camera, a digital camera, an image reproducing apparatus, a mobile computer, a personal computer, a cellular phone, and a car audio apparatus.

19. A personal computer comprising:
   an electroluminescence element comprising an anode, a cathode, and an electroluminescence layer between said anode and said cathode, formed over a substrate; and
   a light shield film in contact with said electroluminescence element, formed over said substrate,
   wherein said cathode comprises a first layer in contact with said electroluminescence layer and a second layer, and
   wherein said first layer comprises a metal containing a group-1 or group-2 element in the periodic table, and said second layer comprises an oxide conductive film.

20. A personal computer according to claim 19, wherein at least one thin film transistor formed over said substrate is electrically connected to said cathode or said anode.

21. A personal computer according to claim 19, said light shield film is a film selected from the group consisting of an insulating film dispersed with metal particles or carbon particles, a titanium film, a titanium nitride film, a chromium film, a molybdenum film, a tungsten film, a tantalum film, or a tantalum nitride film, and a semiconductor film.

22. A personal computer according to claim 19, wherein said first layer is 5–70 nm in thickness.

23. A cellular phone comprising:
   an electroluminescence element comprising an anode, a cathode, and an electroluminescence layer between said anode and said cathode, formed over a substrate; and
   a light shield film in contact with said electroluminescence element, formed over said substrate,
   wherein said cathode comprises a first layer in contact with said electroluminescence layer and a second layer, and
   wherein said first layer comprises a metal containing a group-1 or group-2 element in the periodic table, and said second layer comprises an oxide conductive film.

24. A cellular phone according to claim 23, wherein at least one thin film transistor formed over said substrate is electrically connected to said cathode or said anode.

25. A cellular phone according to claim 23, said light shield film is a film selected from the group consisting of an insulating film dispersed with metal particles or carbon particles, a titanium film, a titanium nitride film, a chromium film, a molybdenum film, a tungsten film, a tantalum film, or a tantalum nitride film, and a semiconductor film.

26. A cellular phone according to claim 23, wherein said first layer is 5–70 nm in thickness.

27. A car audio apparatus comprising:
   an electroluminescence element comprising an anode, a cathode, and an electroluminescence layer between said anode and said cathode, formed over a substrate; and
   a light shield film in contact with said electroluminescence element, formed over said substrate,
   wherein said cathode comprises a first layer in contact with said electroluminescence layer and a second layer, and
   wherein said first layer comprises a metal containing a group-1 or group-2 element in the periodic table, and said second layer comprises an oxide conductive film.

28. A car audio apparatus according to claim 27, wherein at least one thin film transistor formed over said substrate is electrically connected to said cathode or said anode.

29. A car audio apparatus according to claim 27, said light shield film is a film selected from the group consisting of an insulating film dispersed with metal particles or carbon particles, a titanium film, a titanium nitride film, a chromium film, a molybdenum film, a tungsten film, a tantalum film, or a tantalum nitride film, and a semiconductor film.

30. A car audio apparatus according to claim 27, said first layer is 5–70 nm in thickness.

* * * * *